United States Patent
Murakami et al.

[11] Patent Number: 5,521,150
[45] Date of Patent: May 28, 1996

[54] METHOD OF JOINING Y-BASED OXIDE SUPERCONDUCTORS

[75] Inventors: Masato Murakami; Hiroshi Takaichi; Naomichi Sakai, all of Tokyo, Japan

[73] Assignees: International Superconductivity Technology Center, Tokyo; Shikoku Denryoku Kabushiki Kaisha, Takamatsu, both of Japan

[21] Appl. No.: 305,915

[22] Filed: Sep. 15, 1994

[30] Foreign Application Priority Data

Sep. 17, 1993 [JP] Japan ................... 5-254984

[51] Int. Cl.$^6$ ................... H01L 39/00
[52] U.S. Cl. ................... 505/450; 228/198; 505/927
[58] Field of Search ................... 228/121, 122.1, 228/124.1, 198, 262.2; 29/599; 505/450, 451, 924, 925, 927, 1

[56] References Cited

U.S. PATENT DOCUMENTS

| | | | |
|---|---|---|---|
| 3,737,989 | 6/1973 | Schaetti | 505/927 |
| 4,914,081 | 4/1990 | Miller et al. | 505/1 |
| 5,100,870 | 3/1992 | Chen et al. | 505/1 |
| 5,134,040 | 7/1992 | Benz et al. | 505/927 |
| 5,164,361 | 11/1992 | Aprigliano et al. | 505/1 |
| 5,244,876 | 9/1993 | Preisler et al. | 505/450 |
| 5,262,391 | 11/1993 | Morita et al. | 505/1 |

FOREIGN PATENT DOCUMENTS

| | | | |
|---|---|---|---|
| 1490637 | 10/1972 | Germany | 505/927 |
| 276180 | 11/1990 | Japan | 505/927 |

OTHER PUBLICATIONS

Japanese Journal of Applied Physics, vol. 28, No. 7, Jul. 1989, Masato Murakami, et al., "A New Process with the Promise of High Jc in Oxide Superconductors", pp. 1189–1194.

Appl. Phys. Lett. 60 (7), Feb. 17, 1992, K. Salama, et al., "Joining of High Current Bulk Y—Ba—Cu—O Superconductors", pp. 898–900.

Primary Examiner—Samuel M. Heinrich
Attorney, Agent, or Firm—Oblon, Spivak, McClelland, Maier & Neustadt

[57] ABSTRACT

Disclosed is a method of joining Y-based oxide superconductors on joining two or more Y-based oxide superconductors made by melting process under pressure, characterized by incorporating $REBa_2Cu_3O_{7-\delta}$ (RE=Y, Ho, Er, Tm or Yb), Ag and $BaCuO_2$-CuO type composition to the joining interface as an adhesive phase for joining. It becomes possible to easily make a joined material that does not deteriorate the superconductive characteristic at joined interface.

11 Claims, 3 Drawing Sheets

METHOD OF JOINING Y-BASED OXIDE SUPERCONDUCTORS

BACKGROUND OF THE INVENTION

The present invention relates to a method of joining Y-based oxide superconductors. The joined material of Y-based superconductors to be made according to the invention is used for magnetic shield, superconductive magnetic carrier equipment, superconductive permanent magnet or the like.

It has been known that the melt-grown Y-based oxide superconductors exhibit exceptionally higher critical current density over the material made by sintering process. A new preparing method named MPMG method (e.g. M. Murakami et al, Jpn. J. Appl. Phys. 28 (1989) 1189)) made it possible to disperse fine normal conductive phase into the crystals. The producted superconductors exhibit high critical current density even in a high magnetic field. Using such materials, applications to magnetic shield etc. are being investigated.

For applying the Y-based oxide superconductors to magnetic shield, it is required to enlarge the area of a piece of superconductor (bulk). It is desirable to put the crystal orientation of bulk in order, because the shielding current flows in the plane spanned by the a-axis and the b-axis of crystals. Consequently, the crystal orientation (the c-axis) is set parallel to the magnetic field. The preparing methods of bulk involving aligned crystals are investigated in many ways, but, at the present time, it is all one can do to prepare crystals as large as several centimeters at most.

For a technique in making a large magnetic shield plate, laminating bulks where the joints not to come to the same position was proposed, but there arose a problem to cause the leakage of magnetic field in a strong magnetic field (e.g. 48th Low Temperature Technology Superconductance Society Proceedings, A3-10 A3-11).

As a means to solve these matters, it was considered to make the bulks large by joining the bulks with preferable crystal orientation. K. Salama and V. Selvamanickam (Appl. Phys. Lett, 60 (1992) 898) and others joined the two pieces of $YBa_2Cu_3O_{7-\delta}$ superconductor (Y123) without deterioration of characteristics at the joined interface by heating them up to a temperature range from 910° C. to 930° C. and keeping for 30 hours under a uniaxial pressure range from 2 to 6 MPa, where nearly pure Y123 bulks were used. For practical use, Y123 bulks with large amount of fine normal conductive phase $Y_2BaCuO_5$ (Y211) are recommended, because they allow high critical current density even in a strong magnetic field.

When we attempted to join the recommended bulks by conventional method, it is difficult to make the joined interface that retains the characteristics of original bulks. The joining process is performed usually through the processes of high-temperature creep, diffusion and rearrangement of atoms. With Y-based oxide superconductor with much Y211 phase dispersed, however, the creep transformation is hard to occur because of composite material comprising Y123 mother phase and Y211 dispersed phase. As a result, portions such as voids are liable to remain at the joined interface. In contrast, such heat treatment for a long time at high temperature near the melting point (about 1000° C.) of Y123 mother phase promotes the deformation of Y123 bulk and the flow-out of liquid phase and leaves the second phases such as Y211 and CuO behind at the interface, resulting in a cause of deterioration of characteristics at the joined interface.

The invention originates in view of such situation and has a purpose to perform the joining of Y-based oxide superconductors to be offered to practical use.

SUMMARY OF THE INVENTION

The invention provides a method of making a good joined interface which inherits the superconductive characteristic from Y123 phase being mother phase, wherein on joining two or more Y-based oxide superconductors (Y123 bulk) made by melting process under pressure, component becoming liquid phase at a temperature lower than the melting point of Y123 bulk such as thin pieces of RE'123 (RE'=Ho, Er, Tm, Yb), Ag powder and $BaCuO_2$-CuO type composition, preferably ($3BaCuO_2+2CuO$) are incorporated beforehand to the joining interface by usually well-known method such as coating or evaporation, then heat treatment is performed for 1 to 10 hours within a temperature range from 900° C. to 990° C. to melt and bond the specimen, and successive cooling is made at a velocity not higher than 2° C./h.

DETAILED DESCRIPTION OF THE INVENTION

As described above, on joining two or more bulks made by melting process under pressure, the incorporated thin pieces of RE'123 (RE' indicate rare-earth elements such as Ho, Er, Tm and Yb) have the following function.

The melting points of Y123, Ho123, Er123, Tm123 and Yb123 are nearly 1000° C., 990° C., 980° C., 960° C. and 900° C., respectively. In the case where a set of bulks and pieces are heated up to the temperature range from 980° to 990° C., thin pieces of Ho123 or Er123 occur creep or cause the partial liquid phase. And, after cooling, they become superconductive phases finally, thus not deteriorating the characteristics at the joined interface. Moreover, the melting point of Ag is about 960° C., and Ag hastens the diffusion and acts to make the joining easy. After cooling, Ag remains in bulk similarly to Ag added to suppress the cracking as a second phase, thus making the supeconductive phase continuous phase and not deteriorating the characteritics at the joined interface.

Figure 1:
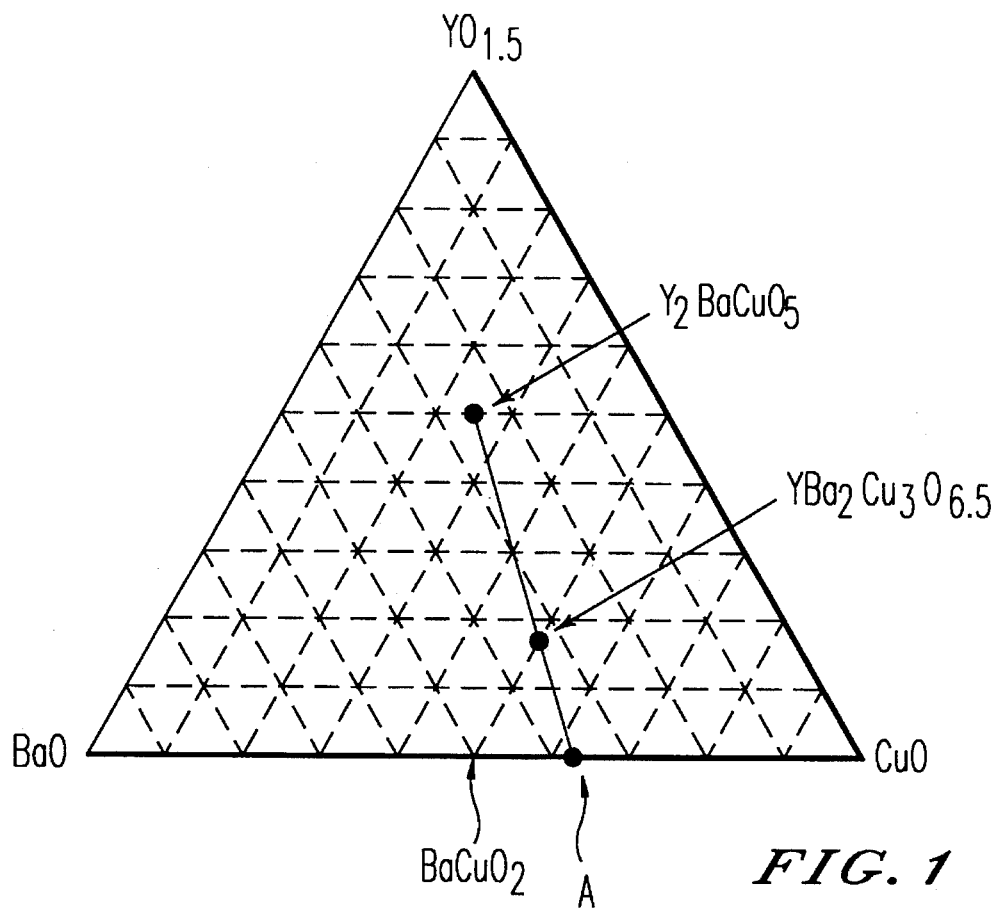
FIG. 1 is a ternary phase diagram of $YO_{1.5}$-BaO-CuO.

$BaCuO_2$-CuO type composition causes the eutectic crystal melting at about 870° C. to generate the liquid phase. Particularly, by using power of a composition ($3BaCuO_2+2CuO$) at a point (point A) where the extension of a line combining Y123 with Y211 intersects with a line of BaO-CuO in the ternary phase diagram of FIG. 1, the following reaction of it with $Y_2BaCuO_5$ existing at the joined interface takes place.

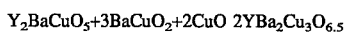

$Y_2BaCuO_5+3BaCuO_2+2CuO\ 2YBa_2Cu_3O_{6.5}$

That is, Y123 phase is newly formed, hence a joined interface retaining the superconductive characteristic can be made wihout damage of Y123 bulk.

There are two conditions. The addition amount of powder is not less than that of liquid phase which is apt to flow away from Y123 bulk at the time of heating. It should not be in excess (not more than molar ratio represented by the reaction formula) to the amount of Y211 particles contained in the surficial layers of several microns depth of Y123 bulk. In case of the excess, Y211 is lost and further CuO and others come to segregation thereof.

As mentioned above, by joining small specimens with crystal orientation put in order using the method of the invention, a large-sized oxide superconductor with crystal orientation put in order can be made. For this reason, when integrating this material into actual equipments etc., it becomes possible to select an equipment with magnetic field opposing to the preferential orientation thereof, resulting in the improved characteristics for magnetic shield, that is, high performance of equipment.

In following, the examples of the invention will be illustrated in detail.

EXAMPLE 1

Powders of $Y_2O_3$, $BaCO_3$ and CuO were mixed so as the ratio of Y:Ba:Cu to become 2.0:2.5:3.5, which was calcined for 12 hours at 920° C. After melting these calcined powders by heating for 30 minutes at 1400° C. in a platinum crucible, they were cooled rapidly on a copper plate and pulverized enough. Ten wt. % of silver oxide were added to this and mixed, which was molded into a cube of 20 mm×20 mm×20 mm. This specimen was heated of 20 minutes at 1100° C., cooled to 1010° C. over 20 minutes, and then submitted to crystal growth down to 870° C. at a velocity of 1° C./h. During the crystal growth, the cube was located in the field, of which temperature gradients is 20° C./cm in the lateral direction and 3° C./cm in the longitudinal direction. The superconductive bulk made under such temperature gradient contained the crystals whose C-axis directions are allligned.

Figure 2:
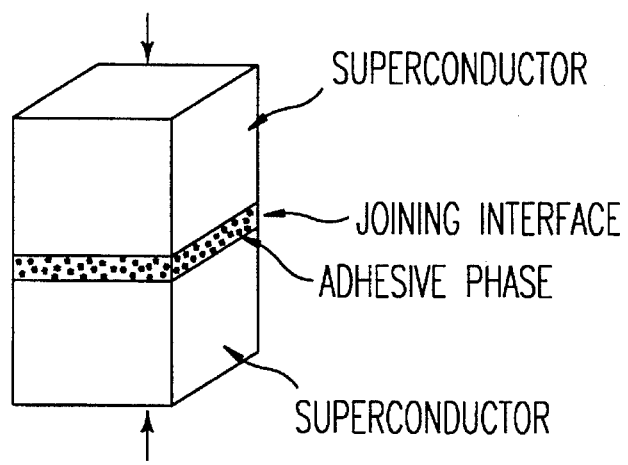
FIG. 2 is an illustration of the joining condition.

From this specimen, a cube of 3 mm×3 mm×3 mm was cut off along c-axis and a face parallel to c-axis was polished, Y-123 paste was coated onto the polished face in a thickness of 10 μm and binder was removed, then pressure of 1 MPa was applied uniaxially bringing the polished faces together. This situation is shown in FIG. 2. Temperature was raised to 965° C. in pressurized state and heat treatment was performed for 5 hours, then cooling was made down to 940° C. at a velocity of 2° C./h. Thereafter, the specimen cooled to room temperature was submitted to the heat treatment for 30 hours at 400° C. in a stream of oxygen to convert to a superconductor. The cross section of specimen was polished to observe the joined interface.

Figure 3:
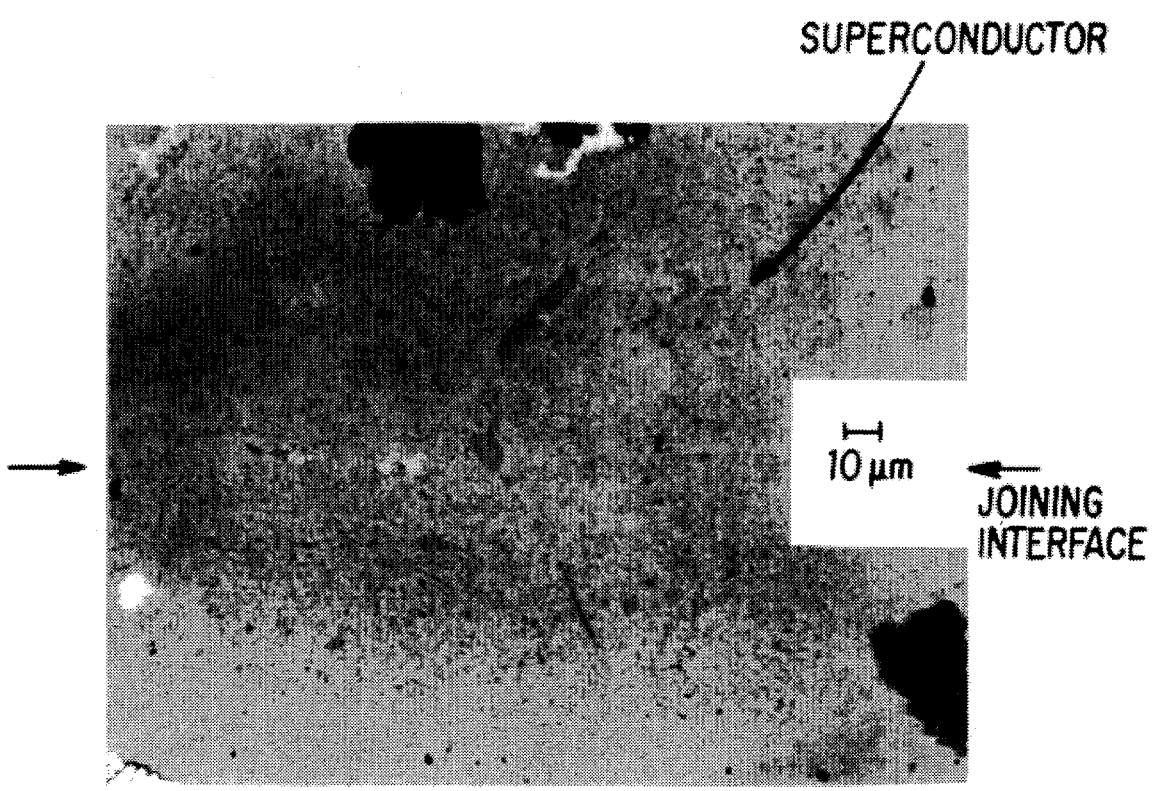
FIG. 3 is a microscopic photograph of the cross section of joined bulks made by 1st procedure.

FIG. 3 shows a photograph of optical microscope at this time. The joined interface is clean, and voids and segregations of Y211 phase cannot be found. The critical current density (Jc) of this specimen measured by pulse current application method was 13400 A/cm² at 77K, 1T.

EXAMPLE 2

Except that ($3BaCuO_2+2CuO$) paste was coated onto the joining face in a thickness of 5 μm, similar treatment to Example 1 was made to prepare the specimen. The critical current density (Jc) of this specimen measured by pulse current application method was 10800A/cm² at 77K, 1T.

EXAMPLE 3

Except that Ag was evaporated onto the joining face in a thickness of 1 μm, similar treatment to Example 1 was made to prepare the specimen. The critical current density (Jc) of this specimen measured by pulse current application method was 12300A/cm² at 77K, 1T.

COMPARATIVE EXAMPLE 1

Figure 4:
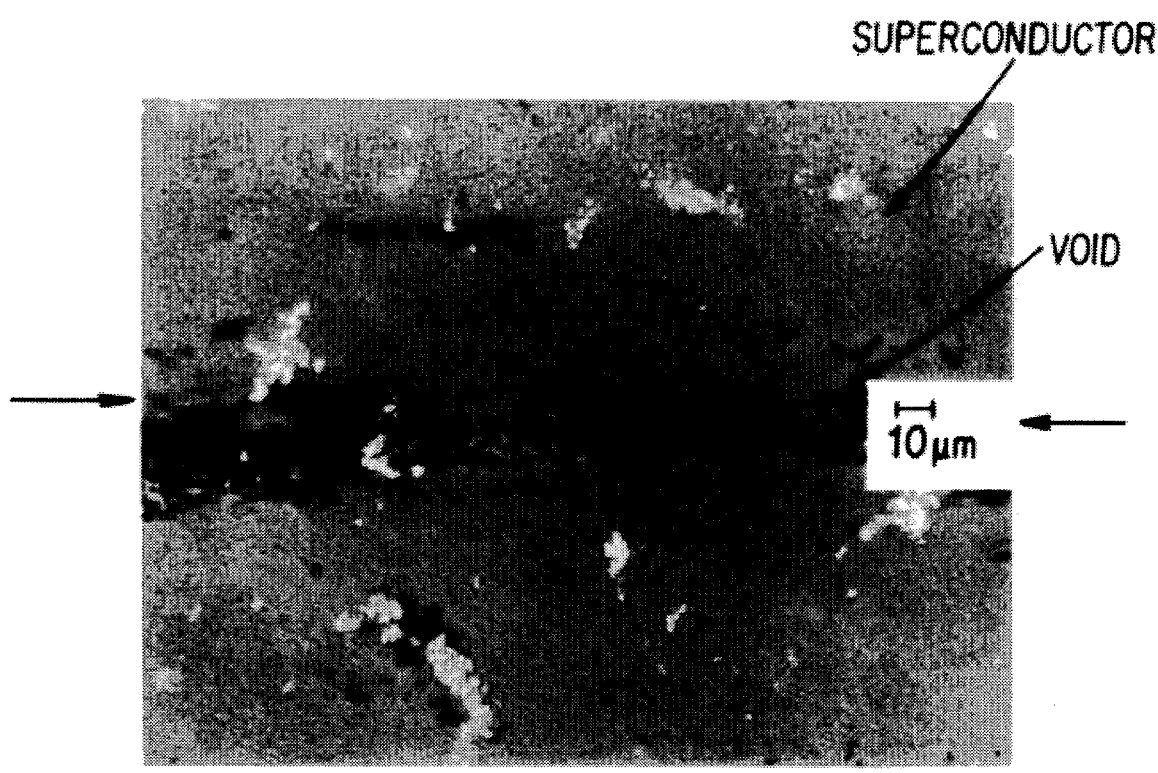
FIG. 4 is a microscopic photograph of the cross section of joined bulks made by the conventional procedure.

Except that Y123 paste was not used on the joining interface at the time of joining treatment, similar treatment to Example 1 was made to prepare the specimen. FIG. 4 shows a sectional photograph of joined interface. From the diagram, it can be seen that many voids remain in the joined interface. Moreover, the critical current density (Jc) of this specimen measured by pulse current application method was 140A/cm² at 77K, 1T.

According to the invention, a large-sized oxide superconductor with crystal orientation put in order can be prepared by joining small specimens with crystal orientation put in order, hence, when integrating this material into actual equipments etc., it becomes possible to select an equipment with magnetic field opposing to the preferential orientation thereof, resulting in the improved characteristics for magnetic shield, that is, high performance of equipment.

What is claimed is:

1. A method of joining Y-based oxide superconductors, comprising the steps of:

inserting thin pieces of the superconductor $RE'Ba_2Cu_3O_{7-\delta}$ between said Y-based oxide superconductors, and applying pressure and heating to form a liquid phase, wherein said superconductor $RE'Ba_2Cu_3O_{7-\delta}$ has a melting point lower than that of said Y-based oxide superconductors, and RE' is selected from the group consisting of Ho, Er, Tm and Yb.

2. A method of joining Y-based oxide superconductors, comprising the steps of:

supplying a powder between said Y-based oxide superconductors, and applying pressure and heating in order to form a liquid phase, wherein said powder comprises a material selected from the group consisting of $REBa_2Cu_3O_{7-\delta}$, Ag or $BaCuO_2$-CuO, and RE is selected form the group consisting of Y, Ho, Er, Tm and Yb.

3. The method of claim 1 or 2, wherein said Y-based oxide superconductors comprise a $Y_2BaCuO_5$ phase in an amount of 5 mol % or more.

4. The method of claim 1 or 2, wherein said Y-based oxide superconductors are aligned crystals.

5. The method of claim 1 or 2, wherein said heating is for 1–10 hours.

6. The method of claim 1 or 2, wherein said heating is at a temperature of 900°–990° C.

7. The method of claim 1 or 2, further comprising the step of cooling at a rate of 2° C./hr or less.

8. The method of claim 2, wherein said powder comprises Ag.

9. The method of claim 2, wherein said powder comprises $REBa_2Cu_3O_{7-\delta}$, and RE is selected from the group consisting of Ho, Er, Tm and Yb.

10. The method of claim 2, wherein said powder comprises $BaCuO_2$-CuO.

11. The method of claim 10, wherein said powder is $BaCuO_2$-CuO with a molar ratio of 3 moles $BaCuO_2$ to 2 moles CuO.

* * * * *

UNITED STATES PATENT AND TRADEMARK OFFICE
CERTIFICATE OF CORRECTION

PATENT NO.  : 5,521,150
DATED       : May 28, 1996
INVENTOR(S) : Masato MURAKAMI, et al.

It is certified that error appears in the above-indentified patent and that said Letters Patent is hereby corrected as shown below:

On the title page, Item [73], the assignees, should read:

--International Superconductivity Technology Center, Tokyo; Shikoku Denryoku Kabushikikaisha, Takamatsu, both of Japan--

Signed and Sealed this

Thirteenth Day of August, 1996

Attest:

BRUCE LEHMAN

*Attesting Officer*        *Commissioner of Patents and Trademarks*